Feb. 16, 1965 J. C. TAYLOR 3,169,378

THERMOELECTRIC CHAMBER

Filed May 10, 1963

WITNESSES

Theodore F. Wrobel

Raymond F. Majesko

INVENTOR

Joseph C. Taylor

BY

C. L. Menzemer

ATTORNEY 3,169,378

THERMOELECTRIC CHAMBER

Joseph C. Taylor, Hempfield Township, Westmoreland County, Pa., assignor to Westinghouse Electric Corporation, Pittsburgh, Pa., a corporation of Pennsylvania Filed May 10, 1963, Ser. No. 279,494
3 Claims. (Cl. 62—3)

The present invention relates to a chamber suitable for controlling the ambient temperature surrounding a semiconductor device disposed within the chamber.

Many semiconductor devices, such as, for example, crystal oscillators are temperature sensitive; and during operation the ambient temperature must be closely controlled to ensure proper frequency stability and the like.

Heretofore, many techniques have been employed to control the ambient temperature surrounding semiconductor devices but with rather unsatisfactory results. In the case of devices, such as, oscillators, the units are frequently housed in a conventional crystal oven. The ovens controlled and maintained the temperature surrounding the crystal by resistance heating. The disadvantage of these ovens are that the temperature being controlled or the surrounding internal ambient must be higher than the temperature resulting from the normal operation of the device. By being able to maintain the surrounding ambient of an oscillator at a lower internal temperature, the aging rate of the semiconductor material is lower and the frequency temperature stability is improved.

Another technique for controlling the ambient temperature is by surrounding the semiconductor device such as, a functional electronic block with an insulating foam or powder. However, it has been found that the thermal conductivity of many of the insulating materials in use today is much too high for practical purposes.

The object of the present invention is to provide a chamber for controlling the ambient temperature surrounding a semiconductor device disposed therein and wherein a relatively small amount of input power is required to maintain the selected temperature within the chamber by the utilization of the Peltier Effect.

Another object of the invention is to provide a thermoelectric chamber comprising an external housing, an internal housing, a thermally insulating material disposed between the internal and external housing, a thermoelectric device disposed within the internal housing and means for hermetically sealing the chamber.

Other objects of the invention will in part be obvious, and will in part, appear hereinafter.

Figure 1:
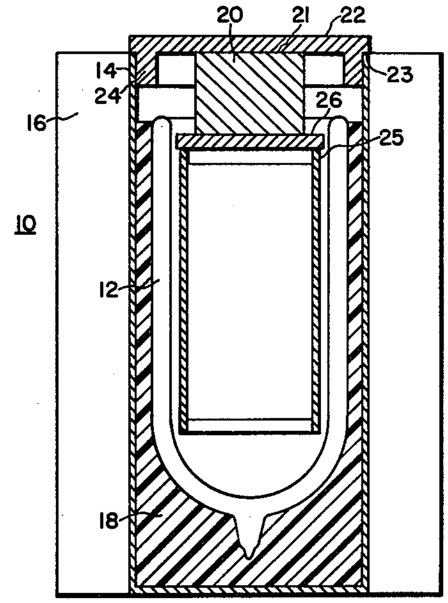
Figures 2, 3:
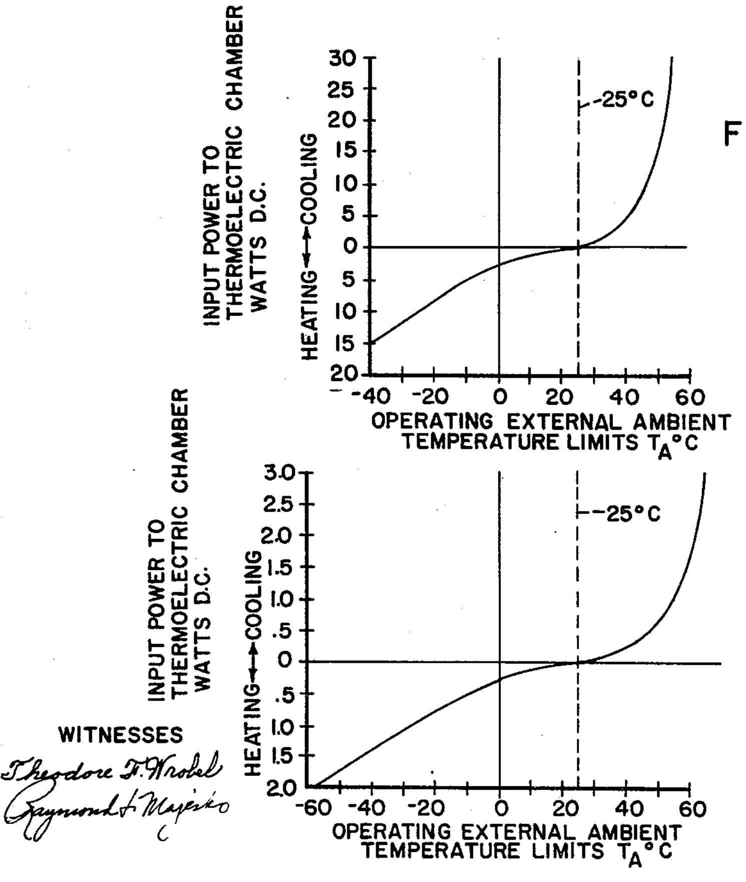

In order to more fully understand the nature and objects of the invention, reference should be had to the following detailed description and drawings, in which:

FIGURE 1 is an elevation view partly in cross-section of the thermoelectric chamber of the invention;

FIG. 2 is a curve indicating the amount of input power required to maintain a constant internal ambient temperature of a quartz crystal oscillator insulated by a foam insulation at various external ambient temperatures; and FIG. 3 is a curve indicating the amount of power required to maintain a constant temperature of a quartz crystal oscillator utilizing the thermoelectric chamber of the invention at various external ambient temperatures.

In accordance with the present invention and in attainment of the foregoing objects there is provided a thermoelectric chamber suitable for controlling the ambient temperature about a semiconductor device. The chamber comprises an inner housing, such as, a Dewar flask which is disposed in an outer housing. A thermally insulating material is disposed between the inner housing or flask and the outer housing to thermally insulate the flask from external temperatures. A thermoelectric device is disposed in the flask within the housing to control the temperature therein. Also, a means is provided for hermetically sealing the flask and housing to prevent heat leakage.

The thermoelectric chamber may be employed to maintain a constant internal ambient temperature about any type of semiconductor device that requires temperature control. Examples of such devices are crystal oscillators, photocells, photomultipliers, reference junctions of thermoelectric couples and functional electronic blocks.

The purpose of the thermoelectric chamber is to maintain the temperature surrounding a particular semiconductor device at its optimum operating temperature even though the external ambient temperature is much higher or lower. The housing for the flask preferably consists of a cylindrical member closed at one end and comprising a relatively good heat dissipating material, such as, for example, aluminum and copper and base alloys thereof. However, other heat dissipating materials would also be satisfactory.

The insulating material between the flask and external housing may comprise any good thermal insulator, such as, for example, silicone rubber, polyester foam, and the like.

A thermoelectric device is employed to control the internal ambient temperature since such devices may provide both heating and cooling and the internal chamber temperature can be controlled and maintained well below the maximum external ambient temperature. The thermoelectric device may comprise a plurality of couples of thermoelectric members comprising thermoelectric materials, such as, lead telluride, germanium telluride, bismuth telluride, indium arsenide, tin telluride or combinations thereof with various dopants, such as, selenium, antimony, copper, bromine, lead and the like or the device may comprise a plurality of couples consisting of thermocouple metals or alloys. It should be understood, however, that the thermoelectric couple materials will be chosen on the basis of its efficiency in the temperature range of operation. Therefore, the choice of materials to be employed is flexible and related to the external ambient temperature and the internal ambient temperature desired. Also, it should be appreciated that other types of heating and cooling devices may be substituted in place of the thermoelectric device.

Referring to FIG. 1 there is shown a thermoelectric chamber 10. The chamber comprises a Dewar flask 12 which is disposed within a cylindrical member 14 having a plurality of heat dissipating fins 16 disposed on the outer periphery of the cylinder (the heat dissipating fins may be dispensed with if desired). The cylinder may comprise any good thermally conductive metal or alloy such as for example copper, aluminum, iron or base alloys thereof. A thermoelectric device 20 consisting of a plurality of thermoelectric couples is attached at end 21 to a cap member 22 which may comprise a metal or alloy similar to the cylinder 14. The cap is disposed on the open end 23 of the cylinder 14 so that the thermoelectric device 20 is suspended within the inner periphery of the cylinder 14 and partially within the inner periphery of the flask 12. The cap 22 may be secured to the open end of cylinder 14 by any method known to those skilled in the art. However, it is preferred to use a mechanical means of attachment such as bolting the cap to the cylinder or by threading the outer surface of ridge 24 of the cap and threading the inner upper end of cylinder 14 to cooperate with the ridge 24. This means of attachment is preferred since the thermoelectric chamber 10 is adaptable for use with any type of semiconductor device and a permanent type of seal would greatly limit the flexibility of the chamber. An inner cylindrical member 25 is secured to the other end 26 of the thermoelectric device 20 and extends well into the flask 12. The joints to ends 21 and 26 of the thermoelectric device are also preferably mechanical joints, such as, screws, bolts, clips and the like, so that the thermoelectric device may be easily replaced if desired. The purpose of cylindrical member 25 is to reduce temperature gradients inside the Dewar flask as well as to provide a receptacle for any type of semiconductor device that requires a close control of temperature during operation.

The semiconductor device may be connected in a desired circuit by passing leads from the device through holes in the cylindrical member 25 thence through electrical conductors which may be provided through cap 22 and hermetically sealed therein.

The following examples are illustrative of the teachings of the invention.

*Example I*

A thermoelectric chamber was fabricated similar to that shown in FIG. 1 except that a Dewar flask was not employed. The outer cylinder consisted of aluminum and the inner surfaces of the cylinder were coated with a relatively thick layer of polyester foam insulation. The thermoelectric device consisted of 72 thermoelectric couples (⅛" x ⅛" x ½"). The p-type material comprised bismuth telluride, antimony telluride and lead. The n-type material comprised bismuth telluride, bismuth selenide and cuprous bromide. A quartz crystal oscillator was disposed in an aluminum cylinder which was suspended within the foam insulation. The outer cylinder was then hermetically sealed with a cap member. With reference to FIG. 2, the curve represents the input power required to maintain the temperature of the quartz crystal oscillator at 25° C. where the external ambient temperatures were varied from −40° C. to +54° C.

*Example II*

A thermoelectric chamber was fabricated similar to the configuration in FIG. 1. A Dewar flask was employed with silicone rubber insulation disposed between the flask and aluminum cylinder. A thermoelectric device consisting of only 12 thermoelectric couples (⅛" x ⅛" x ½") comprising the same p- and n-type thermoelectric materials as in Example I was secured to a cap member by means of screws and the cap member was secured to the upper end of the outer cylindrical member by means of screws passing through the outer cylindrical member and through the ridge of the cap member. A quartz crystal oscillator was disposed in the inner cylindrical member. Referring to FIG. 2 the curve represents the input power required to maintain the temperature of the quartz crystal oscillator at 25° C. where the external ambient temperature ranged from −60° C. to +65° C.

It is readily apparent from the two examples that the use of a Dewar flask as a chamber greatly reduces the power required to maintain a desired constant internal ambient temperature about semiconductor devices.

It should be understood that the thermoelectric chamber may be integrally attached to a power source to provide the necessary power for the thermoelectric device and to provide the necessary components to automatically control the ambient temperatures within the chamber.

It is intended that the foregoing description and drawings be construed as illustrative and not in limitation of the invention.

I claim as my invention:

1. A thermoelectric chamber suitable for controlling the ambient temperature about temperature sensitive semiconductor devices comprising a Dewar flask, an outer housing surrounding the flask, a thermally insulating material disposed along the bottom and side walls of the flask between the flask and the housing, a thermoelectric device disposed within the flask and housing and means for hermetically sealing the flask and housing.

2. A thermoelectric chamber suitable for controlling the ambient temperature about temperature sensitive semiconductor devices comprising a Dewar flask, a heat dissipating and support cylinder closed at one end thereof surrounding the flask, a thermally insulating material disposed along the bottom and side walls of the flask between the flask and the housing, a thermoelectric device disposed within the flask, means for positioning the thermoelectric device within the flask, means for positioning a semiconductor device within the flask and means for hermetically sealing the open end of the flask and housing.

3. A thermoelectric chamber suitable for controlling the ambient temperature about temperature sensitive semiconductor devices comprising a Dewar flask, an outer heat dissipating and support cylinder closed at one end thereof surrounding the flask, a thermally insulating material disposed between the flask and the housing, a thermoelectric device disposed within the flask, a cap member disposed on the open end of the housing to provide a hermetic seal therefor, the thermoelectric device being secured at one end thereof to the inner surface of the cap member to hold the device in situ and an inner cylindrical member secured to the other end of the thermoelectric device to provide a support for a semiconductor device within the flask.

References Cited in the file of this patent

UNITED STATES PATENTS

| | | |
|---|---|---|
| 1,818,221 | Huber | Aug. 11, 1931 |
| 2,160,184 | Wilheln | May 30, 1939 |
| 2,686,268 | Martin | Aug. 10, 1954 |
| 2,711,084 | Bergan | June 21, 1955 |
| 3,064,440 | Waller | Nov. 20, 1962 |
| 3,091,940 | Feldman | June 4, 1963 |